United States Patent [19]
Chen

[11] Patent Number: 5,936,419
[45] Date of Patent: Aug. 10, 1999

[54] TEST METHOD AND APPARATUS UTILIZING REACTIVE CHARGING CURRENTS TO DETERMINE WHETHER A TEST SAMPLE IS PROPERLY CONNECTED

[75] Inventor: Pin-Yi Chen, Taipei, Taiwan

[73] Assignees: Extech Electronics Co., Ltd., Taipei Hsien, Taiwan; Associated Research, Inc., Lake Bluff, Ill.

[21] Appl. No.: 08/869,994

[22] Filed: Jun. 5, 1997

[51] Int. Cl.$^6$ .................................................. G01R 31/02
[52] U.S. Cl. .......................... 324/756; 324/536; 324/456; 340/647
[58] Field of Search ..................................... 340/656, 654, 340/647; 324/756, 715, 718, 456, 536

[56] References Cited

U.S. PATENT DOCUMENTS

| | | | |
|---|---|---|---|
| 3,867,693 | 2/1975 | Saxenmeyer | 324/756 |
| 4,342,957 | 8/1982 | Russell | 324/754 |
| 4,876,515 | 10/1989 | Ball | 324/538 |
| 5,079,506 | 1/1992 | Choi | 324/705 |
| 5,512,841 | 4/1996 | Gibson | 324/756 |
| 5,568,054 | 10/1996 | Iino | 324/756 |

FOREIGN PATENT DOCUMENTS

| | | | |
|---|---|---|---|
| 401120031 | 5/1989 | Japan | 324/756 |
| 403033663 | 2/1991 | Japan | 324/756 |

*Primary Examiner*—Josie Ballato
*Assistant Examiner*—Jose M. Solis
*Attorney, Agent, or Firm*—Bacon & Thomas

[57] ABSTRACT

Prior to beginning a dielectric withstand (leakage current) or insulative impedance test, but after applying the high voltage that will be used in the test, the temporary charging currents resulting from application of the high voltage are measured and analyzed to determine if the test sample is properly connected to the test apparatus. If no charging currents are measured, or if the insulation resistance is too high, then it is determined that the test sample is not properly connected and the test is terminated.

9 Claims, 4 Drawing Sheets

TEST METHOD AND APPARATUS UTILIZING REACTIVE CHARGING CURRENTS TO DETERMINE WHETHER A TEST SAMPLE IS PROPERLY CONNECTED

BACKGROUND OF THE INVENTION

The present invention relates to an open circuit test method for DC leakage current (dielectric withstand) or insulative impedance testing, which tests the connection between the test apparatus and the test sample before starting to test the leakage current of the test sample. The present invention relates also to a test apparatus for performing the test method.

When an electronic product is produced, it may be tested through a DC leakage current test or an insulative impedance test. An electronic product is approved only when the leakage current value is measured zero(i.e., approximately zero; due to the limitations in apparatus precision, the test result is shown as zero) or the insulative impedance value is measured to be infinitely great (i.e., approximately infinitely great; due to limitations in apparatus precision, the test result is shown as infinitely great). However, if the test sample is not properly connected to the test apparatus or the test sample and the test apparatus are not normally connected due to certain factors, a false test result will occur.

SUMMARY OF THE INVENTION

The present invention provides an open circuit test method for DC leakage current or insulative impedance tests which tests the connection between the test apparatus and the test sample, before starting to test the leakage current of the test sample. It is one object of the present invention to provide an output open circuit test method which detects the charging current of the test sample within a set length of time, compares the measured current value with a predetermined charging current lower limit value, and stops the test apparatus from testing the test sample if the measured current value is below the predetermined charging current lower limit value. It is another object of the present invention to provide an output open circuit test apparatus which detects the connection of the test sample before starting a DC leakage current test or insulative impedance test, stops the test operation and provides a warning signal when the test results shows an open circuit status.

DETAILED DESCRIPTION OF THE PREFERRED EMBODIMENT

Figure 1:
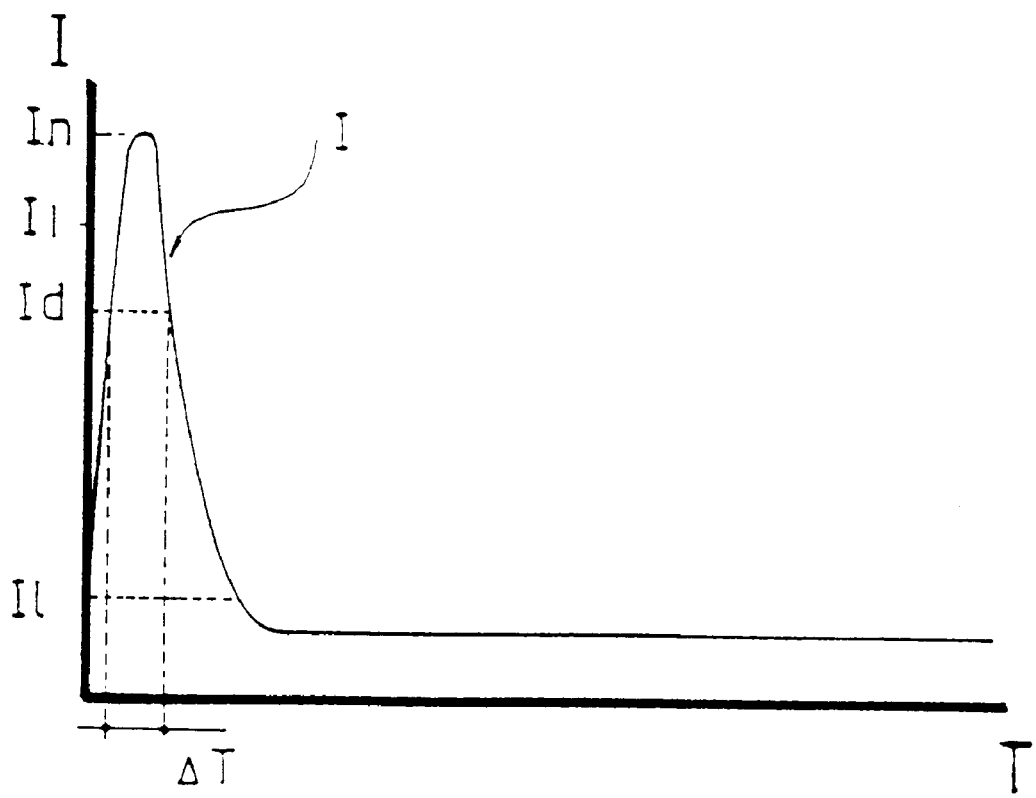
FIG. 1 is a current-time curve showing the relationship between time and current after the application of a high voltage to a capacitive reactance test sample.

A load generally has a capacitive reactance value. The physical property of the capacitive reactance of a load is that when a high voltage power supply is added to the input and output ends, it charges the load, causing an instant charging current to be produced (see FIG. 1). After charging of the high voltage power supply to the load, i.e., after charging currents have decayed, a certain amount of leakage current may be present in the load subject to the material property of the load.

The present invention utilizes the aforesaid physical property to set a charging current lower limit value Id, permitting the set charging current lower limit value Id and a predetermined test charging current time zone $\Delta T$ to be input into the test apparatus (which can be a DC leakage current (dielectric withstand) test apparatus or an insulation resistance test apparatus) before starting the test on the test sample. The charging current lower limit value Id is set to be the assumed lowest charging current value produced by the test sample after the application of a high voltage power supply to the test sample. The test charging current time interval $\Delta T$ is defined as a predetermined time range or interval during which a charging current is assumed to be present in the test sample as a result of a charging action after the application of a high voltage power supply to the test sample. The test charging current time interval $\Delta T$ is defined subject to the material property of the test sample and the value of the high voltage power supply applied.

Figure 2A:
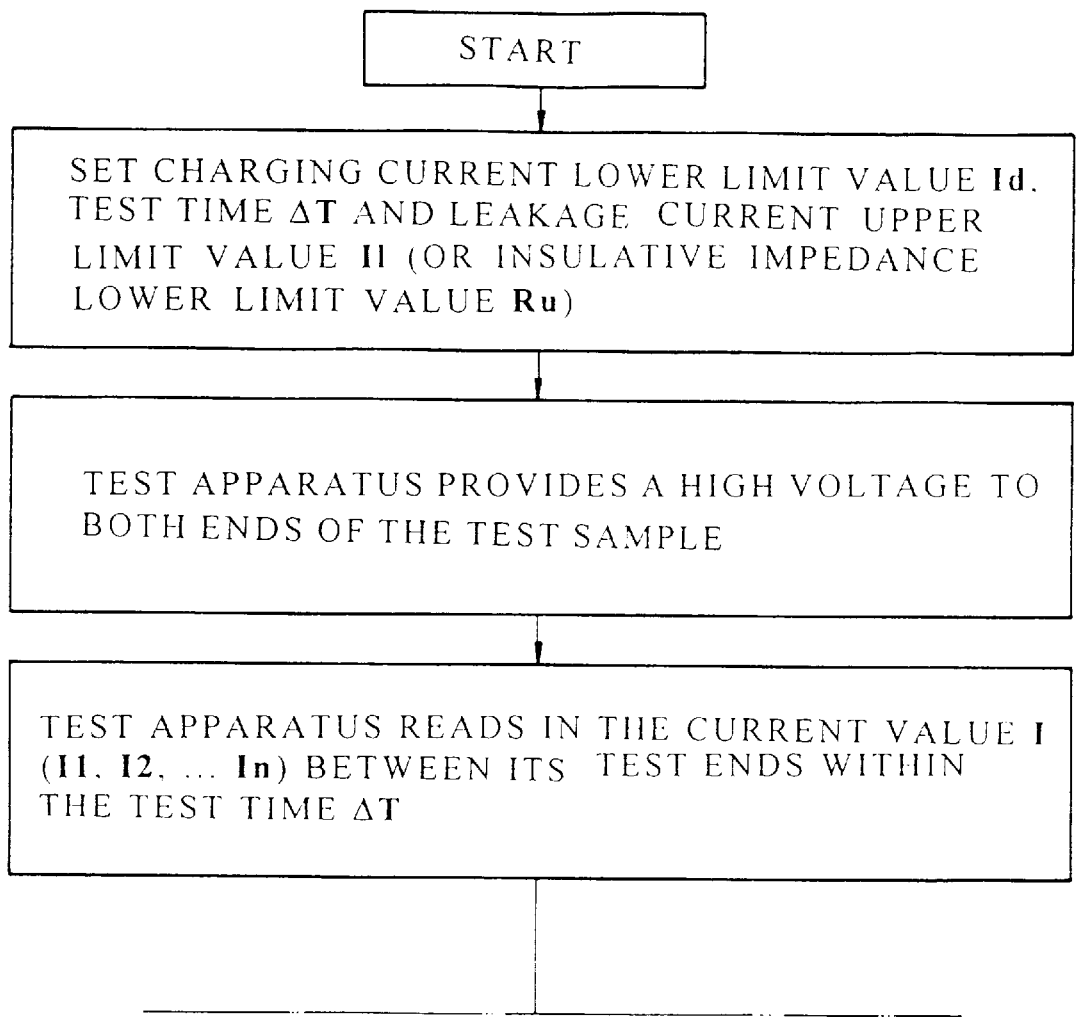
FIGS. 2A and 2B are flow charts explaining the performance of the method of the present invention.
Figure 2B:
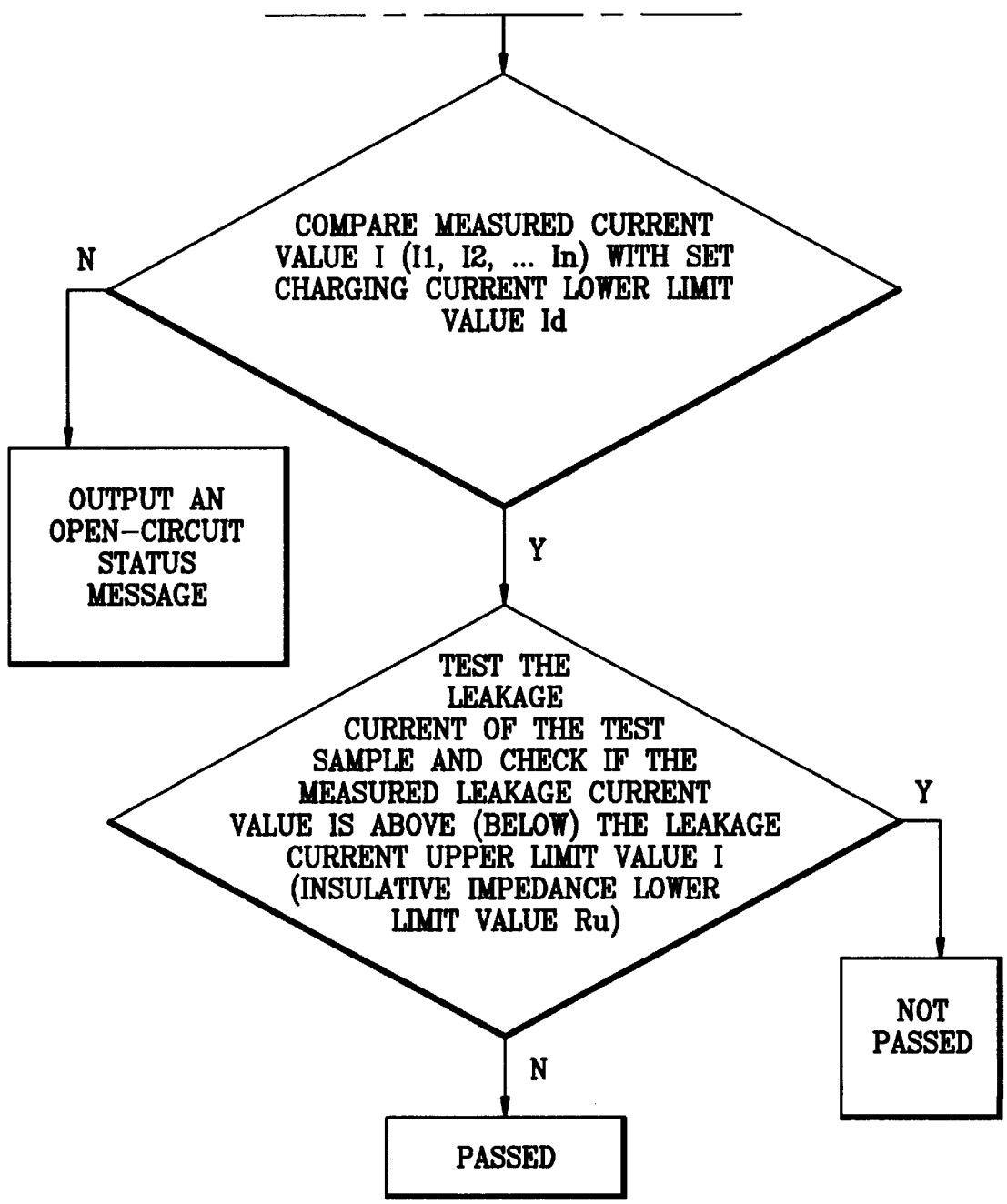

The test procedure of the present invention is outlined hereinafter with reference to FIG. 2. At first, the charging current lower limit value Id, the test charging current time zone $\Delta T$ and the leakage current upper limit value I1 (or insulative impedance lower limit value Ru) are input into the test apparatus. The leakage current upper limit value I1 (or insulative impedance lower limit value Ru) means the standard value which conforms to the safety rules. Then, a high voltage power supply is connected to two opposite test ends of the test apparatus, and the continuous current value I between the two test ends of the test apparatus is measured during the test charging current time interval $\Delta T$ It is also recommendable to measure current value I1, I2, ... In by intermittent sampling. According to the current value measured, the test apparatus judges if there is an instant current i in the continuous current values I that surpasses the charging current lower limit value Id. If there is an instant current i (or current value I1, I2 ... or In) in the continuous current values I that surpasses the charging current lower limit value Id, it means that the connection between the test sample and the test apparatus is normal. If the connection between the test sample and the test apparatus is normal, the test apparatus is started to test the leakage current (or insulation impedance), and to check if the leakage current (or insulation impedance) of the test sample is below the leakage current upper limit value I1 (or insulative impedance lower limit value Ru). If there is not any instant current i (or current value I1, I2 ... or In) that surpasses the charging current lower limit value Id, the test apparatus immediately stops the test, and shows a message indicating that the test sample is not connected to the two test ends of the test apparatus, and then provides an alarm signal through its alarm.

Figure 3:
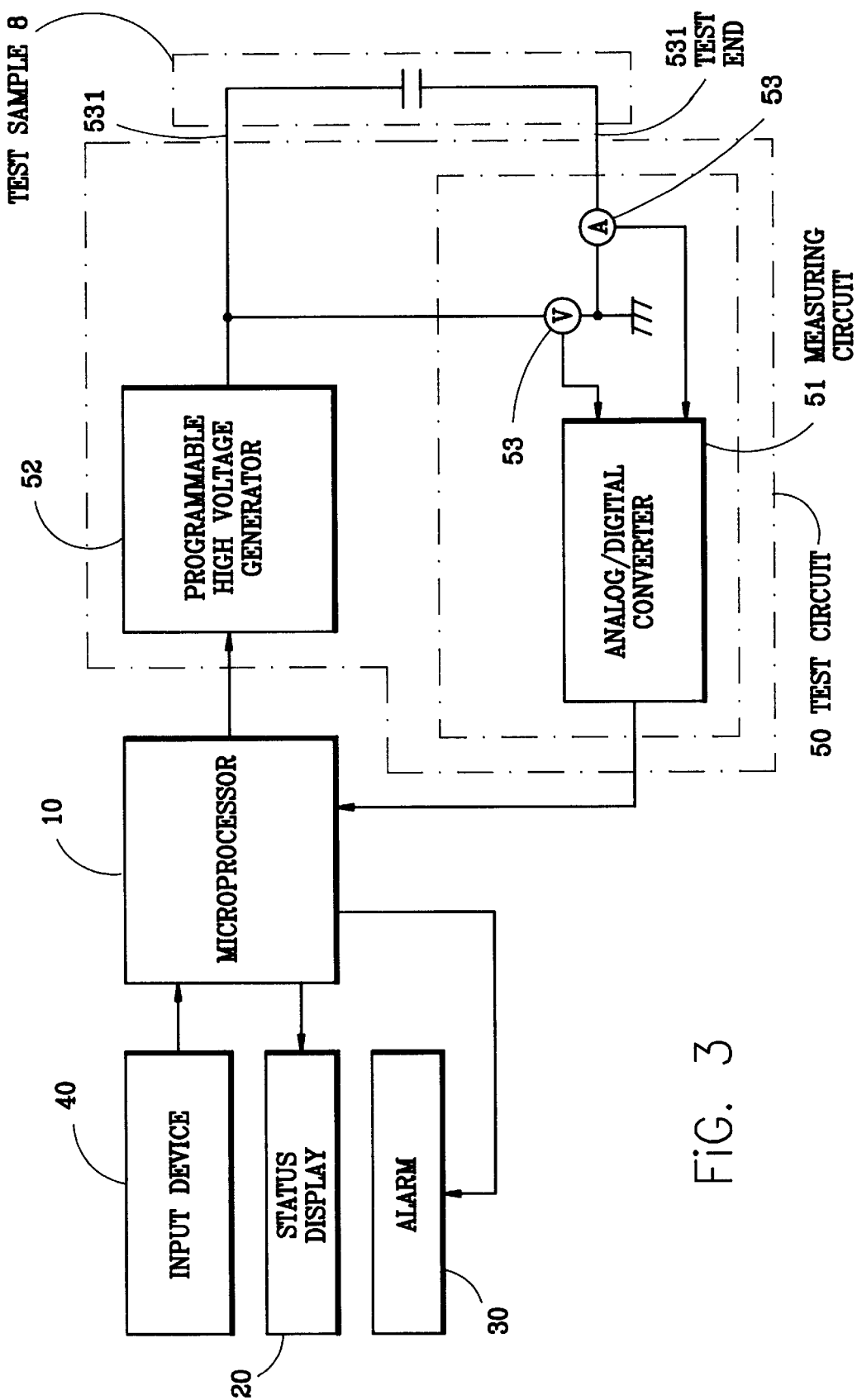
FIG. 3 is a circuit block diagram of a test apparatus according to the present invention.

Referring to FIG. 3, the test apparatus comprises a microprocessor (CPU or MPU) 10, a status display 20, an alarm (for example a siren) 30, an input device (for example a keyboard) 40, and a test circuit 50. The test circuit 50 is comprised of an analog/digital converter 51, a programmable high voltage generator 52, and a measuring circuit 53. The measuring circuit 53 can be an ammeter or voltmeter.

During a test, the test sample 8 is connected to the two test ends 531 of the measuring circuit 53, and then the charging current lower limit value Id, the test charging current time zone $\Delta T$ and the leakage current upper limit value I1 (insulative impedance lower limit value Ru) are input into the microprocessor 10 through the input device 40, and the microprocessor 10 is started to drive the programmable high voltage generator 61, causing it to provide a high voltage to the test sample 8. Within the test charging current time zone ΔT after the application of the high voltage to the test sample 8, the microprocessor 10 drives the measuring circuit 53 to measure the electric currents I between its two test ends 531. The analog sum of the electric current values I thus measured is then transmitted from the measuring circuit 53 to the analog/digital converter 51 and then converted by it into a digital signal. The digital signal of the current values I (or current values I1, I2 . . . or In) thus obtained is then sent to the microprocessor 10 for comparison with the set charging current lower limit value Id. If the comparison result shows that the current values I are below the set charging current lower limit value Id, the microprocessor 10 shows the message through the status display 20, and provides a warning signal through the alarm 30, informing the user that the test sample 8 is not normally connected to the test apparatus. If the comparison result shows that the current values I surpass the set charging current lower limit value Id, the test apparatus immediately starts to test the leakage current (or insulative impedance) of the test sample, so as to prevent a false judgment due to non-connection of the test sample 8 to the test apparatus.

In the aforesaid test method or apparatus, a set insulative impedance value Rc may be used as a test standard instead of the charging current lower limit value Id (because the impedance value of the test sample is indirectly proportional to its current value). After the set insulative impedance value Rc, the test charging current time zone ΔT and the leakage current upper limit value I1 (insulative impedance lower limit value Ru) have been input into the test apparatus, a high voltage power supply is provided to the two test ends 531 of the measuring circuit 53, and then the continuous insulative impedance value R (it is also recommended to measure impedance value R1, R2, . . . Rn between the two test ends 531 by intermittent sampling) is measured within the test charging current time zone ΔT. Thus, based on the measured insulative impedance value R, the test apparatus judges if there is an instant insulative impedance r below the set insulative impedance value Rc. If it is judged that there is an instant insulative impedance r (or resistance value R1, R2, . . . or Rn) of the continuous insulative impedance value R below the set insulative impedance value Rc, it means that the connection between the test sample 8 and the test apparatus is normal, Thus, the test apparatus continues to test the leakage current (insulative impedance) of the test sample 8, checking if the leakage current (insulative impedance) of the test sample 8 is in conformity with the set leakage current upper limit value I1 (insulative impedance lower limit value Ru). If the test result shows that no instant insulative impedance r (R1, R2, . . . or Rn) is below the set insulative impedance value Rc, the test apparatus immediately stops testing the test sample 8, drives the microprocessor 10 to show the status through the status display 20, and provides a warning signal through the alarm 30, informing the user that the test sample 8 is not normally connected to the test apparatus. If the test result shows that the instant insulative impedance r current value I is below the set insulative impedance value Rc, the test apparatus immediately starts to test the leakage current (insulative impedance) of the test sample 8, so as to prevent a false judgment due to non-connection of the test sample 8 to the test apparatus.

While only one embodiment of the present invention has been shown and described, it will be understood that various modifications and changes could be made thereunto without departing from the spirit and scope of the invention disclosed.

What the invention claimed is:

1. A test apparatus, comprising:
    a microprocessor;
    a status display controlled by said microprocessor to display a test status; and
    a test circuit controlled by said microprocessor to perform one of a leakage current test and an insulative impedance test on a test sample, said high voltage causing charging currents to flow as a result of capacitances in said test sample, said one of said leakage current test and said insulative impedance test being carried out after said charging currents have ceased to flow,
    wherein said test circuit includes:
        a programmable high voltage generator arranged to generate said high voltage and having an input end connected to an output end of said microprocessor and an output end; and
        an analog-to-digital converter having an input end connected to the output end of said high voltage generator, and an output end connected to an input end of said microprocessor, and
    wherein said microprocessor is arranged to analyze a measured charging current based on the following predetermined test parameters: (i) a predetermined charging current lower limit value and (ii) a predetermined test initial time interval,
        wherein said charging current lower limit value is a value related to the lowest charging currents present in said test sample after application of the high voltage when said test sample is properly connected to the test apparatus, and
        wherein said time interval is a predetermined time range during which the charging currents are assumed to be present in said test sample after application of the high voltage to said test sample;
    said microprocessor being arranged to permit said test apparatus to perform said leakage current or insulative impedance tests when a measured current value surpasses said predetermined charging current lower limit value, and to prevent said test apparatus from performing said test when the measured current value fails to surpass said predetermined charging current lower limit value, said failure of said test apparatus to measure charging currents that surpass the predetermined charging current lower limit value indicating that the test sample is not connected to the test apparatus.

2. Apparatus as claimed in claim 1, wherein said microprocessor is a micro controller.

3. Apparatus as claimed in claim 1, wherein said predetermined charging current lower limit value is a set insulative impedance value of said test sample.

4. Apparatus as claimed in claim 1, further comprising an alarm circuit controlled by said microprocessor to produce an alarm signal when said test sample and said measuring circuit are in an open circuit status as determined by said comparison between said measured charging current and said predetermined limit value during said time interval.

5. Apparatus as claimed in claim 1, wherein said measuring circuit is an ammeter.

6. Apparatus as claimed in claim 1, wherein said measuring circuit includes a voltmeter.

7. Apparatus as claimed in claim 1, wherein said microprocessor is a central processing unit (CPU) of said apparatus.

8. A test method, comprising the steps of:
    (a) providing a test apparatus arranged to apply a high voltage to opposite ends of a test sample, said high voltage being sufficiently high to enable the test apparatus to perform one of a leakage current test and an insulative impedance test on the test sample, and said high voltage causing charging currents to flow in said test sample as a result of capacitances in said test sample, said charging currents decaying as the test sample is charged, wherein said one of said leakage current test and insulative impedance tests are carried out after said initial charging currents have decayed;

(b) inputting into the test apparatus the following predetermined test parameters: (i) a predetermined charging current lower limit value Id and (ii) a predetermined initial time interval $\Delta T$, wherein said charging current lower limit value Id is an assumed lowest value of the charging currents that are present in said test sample after the application of the high voltage when said test sample is properly connected to said test apparatus, and wherein said time interval $\Delta T$ is a predetermined time range during which said charging currents are assumed to be present in said test sample after application of the high voltage to said test sample;

(c) operating said test apparatus to apply the high voltage to the test sample and measure current values I, if any, between said two opposite ends of said test sample during said predetermined initial time interval $\Delta T$;

(d) comparing the current values I measured during said predetermined initial time interval $\Delta T$ with said predetermined charging current lower limit value Id;

(e) permitting said test apparatus to perform said one of said leakage current test and said insulation impedance test when one of the current values I surpasses said predetermined charging current lower limit value Id, (f) preventing said test apparatus from performing said one of said leakage current test and insulation impedance test when the measured current values I fail to surpass said predetermined charging current lower limit value Id, said failure of said test apparatus to measure charging currents whose values exceed the predetermined charging current lower limit value Id indicating that the test sample is not properly connected to the test apparatus.

9. A test method, comprising the steps of:

(a) providing a test apparatus arranged to apply a high voltage to opposite ends of a test sample, said high voltage being sufficient to enable the test apparatus to perform a leakage current or insulative impedance test on the test sample, said high voltage causing charging currents to flow in said test sample as a result of capacitances in said test sample, said charging currents decaying as the test sample is charged, wherein said leakage current or insulative impedance tests are carried out after said initial charging currents have decayed;

(b) inputting into the test apparatus the following predetermined test parameters: (i) a predetermined insulative impedance value, and (ii) a predetermined initial time interval $\Delta T$, wherein said time interval $\Delta T$ is a predetermined time range during which said charging currents are assumed to be present in said test sample after application of the high voltage to said test sample;

(c) operating said test apparatus to apply the high voltage to the test sample and measure an initial insulative impedance between said two opposite ends of said test sample during said predetermined initial time interval $\Delta T$;

(d) comparing the initial insulative impedance measured during said predetermined initial time interval $\Delta T$ with said predetermined insulative impedance value;

(e) permitting said test apparatus to perform said one of said leakage current or insulation impedance tests when said initial insulative impedance value surpasses said predetermined insulative impedance value, (f) preventing said test apparatus from performing said insulation impedance test when the measured initial insulative impedance value fails to surpass said predetermined initial insulative impedance value, said failure of said test apparatus to measure a an initial insulative impedance value that exceeds the predetermined insulative impedance value indicating that the test sample is not properly connected to the test apparatus.

* * * * *